(12) United States Patent
Müller

(10) Patent No.: US 6,538,876 B2
(45) Date of Patent: Mar. 25, 2003

(54) PC SWITCHGEAR CABINET

(75) Inventor: Norbert Müller, Dietzhölztal (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 09/903,428

(22) Filed: Jul. 11, 2001

(65) Prior Publication Data

US 2003/0011968 A1 Jan. 16, 2003

(51) Int. Cl.⁷ .................................................. H02B 5/00
(52) U.S. Cl. ........................ 361/605; 361/679; 361/724; 312/223.3
(58) Field of Search ............................ 108/147, 114.11, 108/50, 51.1; 312/223.3, 223.6, 194; 361/600, 724–727, 826–827, 679–683

(56) References Cited

U.S. PATENT DOCUMENTS

| | | | | | |
|---|---|---|---|---|---|
| 4,491,375 | A | * | 1/1985 | Ugalde | 312/223.3 |
| 4,640,199 | A | * | 2/1987 | Zigman | 312/223.3 |
| 5,806,943 | A | * | 9/1998 | Dell et al. | 312/223.3 |
| 6,099,093 | A | * | 8/2000 | Spence | 312/223.3 |

* cited by examiner

Primary Examiner—Gregory Thompson
(74) Attorney, Agent, or Firm—Pauley Petersen Kinne & Erickson

(57) ABSTRACT

A PC switchgear cabinet with electronic components, a work shelf and a visual display unit. A versatile embodiment with a considerably enlarged work and storage area is created because of a lower element designed as switchgear cabinet, of a center element, which can be used as a work shelf and/or a storage shelf, and of the visual display unit arranged on the center element.

17 Claims, 1 Drawing Sheet

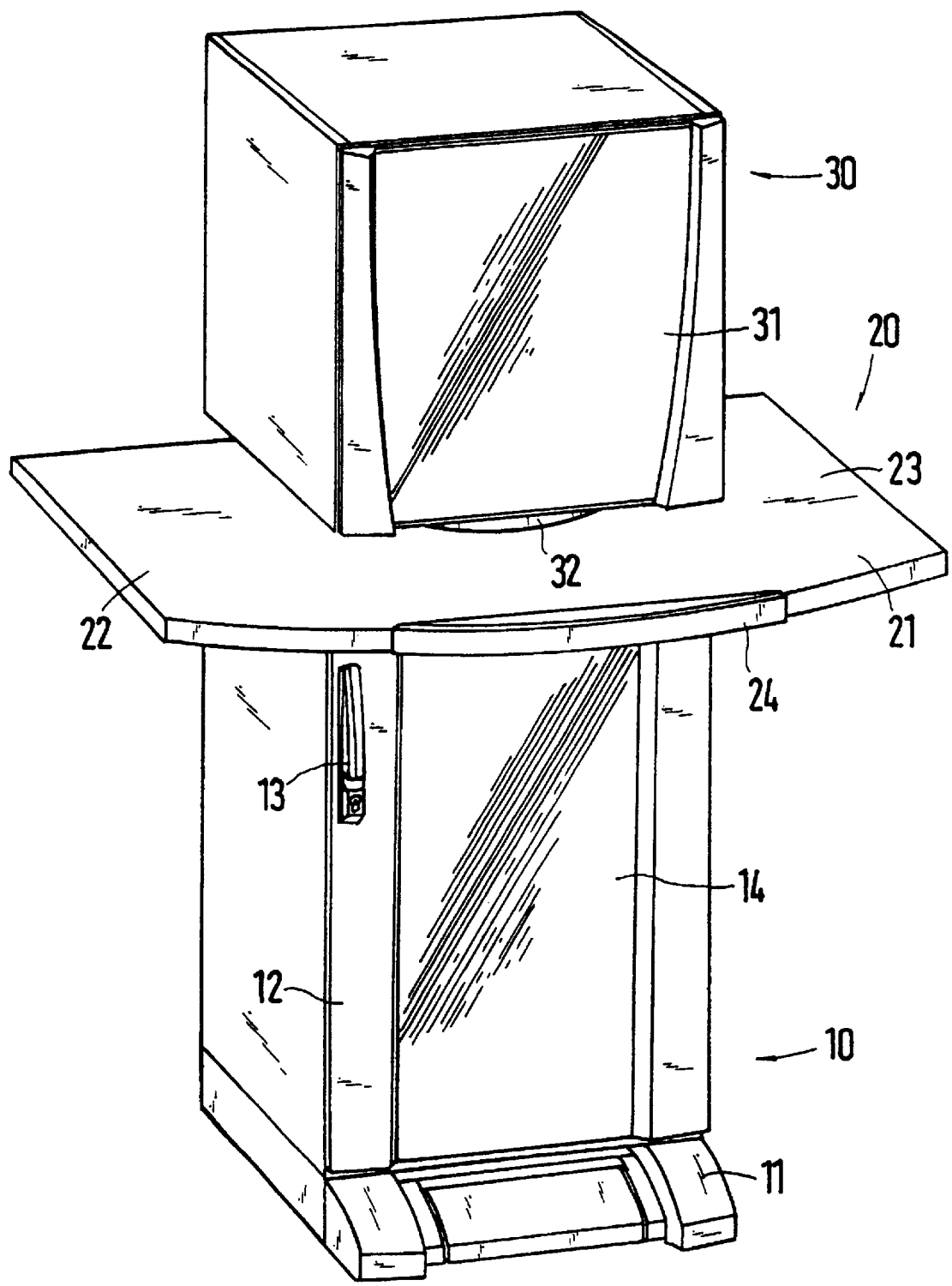

PC SWITCHGEAR CABINET

BACKGROUND OF THE INVENTION

1. Field of the Invention

This invention relates to a PC switchgear cabinet with electronic components, a work shelf and a visual display unit.

2. Description of Related Art

With continuing developments in the field of control and the field of communications, such PC switchgear cabinets are used with increasing frequency. All required components are placed into a specially designed switchgear cabinet housing. The work shelf is preferably housed in the switchgear cabinet so it can be pulled out, and is therefore defined by the size of the cross section of the switchgear cabinet. However, particularly elaborately designed pull-outs exist, whose work and storage surface can be increased in the pulled-out state. These pull-outs are not only expensive, but continue to be limited in their surface area.

As they have been put to use, these customary PC switchgear cabinets are now required to work together with further peripheral devices, for which the conventional PC cabinet does not have space. The same applies to the testing devices required for maintenance and/or repairs, and finally the housing of the required electronic components in the PC switchgear cabinet is limited to a fixed installation system.

SUMMARY OF THE INVENTION

It is one object of this invention to provide a switchgear cabinet of the type mentioned above but which is considerably more flexible in the space availability for peripheral devices and for which the system layout for the electronic components can be more generously designed.

In accordance with this invention, this object is attained because the PC switchgear cabinet includes a lower element, designed as switchgear cabinet, a center element, which can be used as work and/or storage shelf, and a visual display unit arranged on the center element.

The switchgear cabinet as the lower element can be embodied in the conventional way in the form of various systems of built-in units and can be integrated into the PC switchgear cabinet. The top of the work and/or storage area can be laid out independently of the dimensions of the switchgear cabinet, so that there is sufficient space for peripheral devices. With a work surface of sufficient size it is possible to place peripheral devices, such as a keyboard, scanner, and the like, on the work and/or storage shelf in addition to the visual display unit. The same applies to required testing devices in case of maintenance or repair. The components or devices to be placed into the PC switchgear cabinet are housed in the lower element designed as a switchgear cabinet, which preferably is designed as a separate conventional switchgear cabinet with appropriate systems of built-in units, and which can also receive peripherals such as printers and the like.

In one embodiment the lower element embodied as a switchgear cabinet contains the electronic components, and thus the stability of the novel PC switchgear cabinet is improved.

In accordance with one embodiment, the switchgear cabinet can be closed off by a cabinet door which has a viewport and can be locked by a locking device. However, this should not be considered to be a limitation of the embodiment of the switchgear cabinet. The switchgear cabinet can also have inserts, device supports which can be pulled out, and the like.

In accordance with a further embodiment, the work and/or storage shelf used as the center element can be a part of the switchgear cabinet and cover the top of the switchgear cabinet. However, the work and/or storage shelf can also close off the top of the switchgear cabinet as a separate center element and can be connected with it.

In accordance with another embodiment, the work and/or storage shelf projects past the switchgear cabinet and the visual display unit on three sides. These are the front of the switchgear cabinet and the two adjoining sides of the switchgear cabinet. In that case the switchgear cabinet can be placed against a wall.

In another embodiment, there is an electrical connection of the visual display unit, and possibly peripheral or testing devices, and the top of the switchgear cabinet and the work and/or storage shelf have cable duct openings which are aligned with each other.

The PC switchgear cabinet in accordance with a further embodiment offers additional operating ease because the visual display unit is connected, rotatable around a vertical axis, with the work and/or storage shelf, and/or the top of the switchgear cabinet by a rotating element.

If an extensible draw-out shelf is contained in the area of the part of the work and/or storage shelf assigned to the front of the switchgear cabinet, it is then possible to provide an additional work shelf and/or storage shelf in a simple way when needed just in the work area of the work shelf and/or storage shelf.

Working at the PC switchgear cabinet can be matched to customary office furniture, for example desks, because the work and/or storage shelf is embodied as a furniture top.

BRIEF DESCRIPTION OF THE DRAWING

This invention is explained in further detail in view of an exemplary embodiment represented in the drawings, wherein:

The single drawing represents a PC switchgear cabinet in a perspective front view.

DESCRIPTION OF PREFERRED EMBODIMENTS

As shown in the drawing, the PC switchgear cabinet comprises, viewed from the bottom to the top in a vertical direction, a lower element 10 designed as a switchgear cabinet, a center element, which can be used as a work and/or storage shelf 20, and the visual display unit 30 arranged on the work and/or storage shelf 20. The switchgear cabinet 10 can be laid out in a conventional manner and as a conventional system of built-in units, and can also have built-in cubicles for peripherals, such as printers and the like. In the embodiment shown, the front of the switchgear cabinet 10 can be closed off by means of a cabinet door 12 with a viewport 14, wherein the cabinet door 12 can be locked in the closed position by means of a lock 13. To improve the stability of the PC switchgear cabinet, the switchgear cabinet 10 is fastened on a base 11, which projects past the front of the switchgear cabinet 10 with the cabinet door 12. The prior art offers a multitude of variations for equipping the switchgear cabinet 10 with pull-outs, drawers and the like, as well as the system of built-in units.

The work and/or storage shelf 20 can be a part of the switchgear cabinet 10 and can cover its top, but it can also be connected with the cover of the switchgear cabinet 10 as a separate center element. In both cases it appropriately protrudes with the partial areas 21, 22 and 23 at the front and the two sides of the switchgear cabinet 10 adjoining it in order to form a sufficiently large work and/or storage shelf. Therefore the novel PC switchgear cabinet offers sufficient space for further peripherals, besides the visual display unit 30, without restricting the work surface on the work and/or storage shelf 20 for the user. The center element can also receive an extensible draw-out shelf 24 in the area 21, which is a part of the work surface, and which is particularly suitable for placing a keyboard.

The top of the switchgear cabinet 10 and the work and/or storage shelf 20 have aligned openings, through which cables are conducted between the switchgear cabinet 10 and the visual display unit 30. Moreover, additional peripherals can be supplied with energy through these from the switchgear cabinet 10 if there is a need for this, and if the required preparations, for example connecting provisions, are or can be made in the switchgear cabinet 10.

As indicated by the rotating element 32, the visual display unit 30 can be rotated about a vertical axis, so that the display 31 can be changed within the field of view of the user. In this case the rotating element 32 can connect the visual display unit 30 with the work and/or storage shelf 20 and/or with the cover of the switchgear cabinet 10 in a limited, freely rotatable manner.

In an adaptation to conventional office furniture, the work and/or storage shelf 20 can also be designed as a furniture top.

What is claimed is:

1. A PC switchgear cabinet for housing electronic components, the PC switchgear cabinet comprising:
   a lower element designed as a cabinet (10), a center element shelf (20), and a visual display unit (30) arranged on the center element, the shelf (20) projecting outward beyond only three sides of the cabinet (10) and the visual display unit (30), and a top element of the cabinet (10) and the shelf (20) having cable duct openings which are aligned with each other.

2. The PC switchgear cabinet in accordance with claim 1, wherein the lower element contains the electronic components.

3. The PC switchgear cabinet in accordance with claim 2, wherein the cabinet (10) is positioned on a base (11) which projects outward at least from a front of the cabinet (10).

4. The PC switchgear cabinet in accordance with claim 3, wherein the cabinet (10) is closed off by a cabinet door (12) which has a viewport (14) and which is locked by a locking device (13).

5. The PC switchgear cabinet in accordance with claim 4, wherein the shelf (20) is a part of the cabinet (10) and forms the top element of the body of the cabinet (10).

6. The PC switchgear cabinet in accordance with claim 4, wherein the shelf (20) is connected with the top element of the cabinet (10) as a separate element.

7. The PC switchgear cabinet in accordance with claim 6, wherein the visual display unit (30) is connected, rotatable about a vertical axis, with at least one of the shelf (20) and the top element of the cabinet (10) by a rotating element (32).

8. The PC switchgear cabinet in accordance with claim 7, wherein the shelf (20) projects beyond the front of the cabinet (10) and two adjoining sides of the cabinet (10).

9. The PC switchgear cabinet in accordance with claim 8, further comprising an extendible draw-out shelf (24) contained in a part (21) of the shelf (20) corresponding to the front of the cabinet (10).

10. The PC switchgear cabinet in accordance with claim 9, wherein the shelf (20) is a furniture top.

11. The PC switchgear cabinet in accordance with claim 1, wherein the cabinet (10) is positioned on a base (11) which projects outward at least from a front of the cabinet (10).

12. The PC switchgear cabinet in accordance with claim 1, wherein the cabinet (10) is closed off by a cabinet door (12) which has a viewport (14) and which is locked by a locking device (13).

13. The PC switchgear cabinet in accordance with claim 1, wherein the shelf (20) is a part of the cabinet (10) and covers the top element of the cabinet (10).

14. The PC switchgear cabinet in accordance with claim 1, wherein the shelf (20) is connected with the top element of the cabinet (10) as a separate element.

15. The PC switchgear cabinet in accordance with claim 1, wherein the visual display unit (30) is connected, rotatable about a vertical axis, with at least one of the shelf (20) and the top element of the cabinet (10) by a rotating element (32).

16. The PC switchgear cabinet in accordance with claim 1, wherein the shelf (20) projects beyond a front of the cabinet (10) and two adjoining sides of the cabinet (10).

17. The PC switchgear cabinet in accordance with claim 1, wherein the shelf (20) is a furniture top.

* * * * *